(12) United States Patent
Mirzaei et al.

(10) Patent No.: US 7,902,917 B2
(45) Date of Patent: Mar. 8, 2011

(54) CURRENT-INPUT CURRENT-OUTPUT RECONFIGURABLE PASSIVE RECONSTRUCTION FILTER

(75) Inventors: Ahmad Mirzaei, Costa Mesa, CA (US); Hooman Darabi, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 12/505,140

(22) Filed: Jul. 17, 2009

(65) Prior Publication Data
US 2011/0012692 A1 Jan. 20, 2011

(51) Int. Cl.
*H03K 5/00* (2006.01)
(52) U.S. Cl. .......................... 327/558; 327/552; 327/344
(58) Field of Classification Search .......... 327/551–559, 327/336–337
See application file for complete search history.

(56) References Cited

U.S. PATENT DOCUMENTS

| | | | |
|---|---|---|---|
| 7,049,882 B2 * | 5/2006 | Pan | 327/543 |
| 7,218,170 B1 * | 5/2007 | Carter et al. | 327/552 |
| 7,555,271 B2 * | 6/2009 | Peng | 455/118 |
| 2009/0189687 A1 * | 7/2009 | Mirzaei et al. | 327/558 |

* cited by examiner

*Primary Examiner* — Dinh T. Le
(74) *Attorney, Agent, or Firm* — Sterne, Kessler, Goldstein & Fox P.L.L.C.

(57) ABSTRACT

Embodiments of the present invention relate generally to reconstruction filtering. In particular, embodiments enable highly linear, highly programmable, and easily reconfigurable reconstruction filters. Further, embodiments provide substantial power consumption, area, and cost savings compared to conventional solutions. For example, embodiments use all-passive filtering and substantially reduce active elements compared to conventional solutions. As a result, significant reductions in required area, noise, and power consumption can be achieved. In addition, embodiments perform filtering solely in the current domain, thereby eliminating the non-linear voltage-to-current conversion used in conventional circuits and enabling highly linear filtering. Furthermore, embodiments are highly programmable and easily reconfigurable without the use of tunable capacitors. As such, embodiments are very suitable solutions for multi-band multi-mode wireless transmitters.

27 Claims, 7 Drawing Sheets

CURRENT-INPUT CURRENT-OUTPUT RECONFIGURABLE PASSIVE RECONSTRUCTION FILTER

BACKGROUND

1. Field of the Invention

The present invention relates generally to reconstruction filtering.

2. Background Art

In practice, the output of a digital-to-analog converter (DAC) needs to be band-limited to prevent aliasing. For this reason, a low-pass filter, called reconstruction filter, is typically used at the output of the DAC in order to reduce unwanted images of the information signal.

Conventional reconstruction filtering solutions have a number of drawbacks, including being inherently non-linear, using many active elements, and being difficult to reconfigure. These drawbacks make conventional solutions unsuitable for use in multi-band multi-mode wireless transmitters, for example, which require reconstruction filters with high bandwidth programmability and reconfigurability. In addition, conventional solutions are high in cost, power consumption, and area requirements.

Accordingly, there is a need for improved reconstruction filtering solutions.

BRIEF SUMMARY

Embodiments of the present invention relate generally to reconstruction filtering. In particular, embodiments enable highly linear, highly programmable, and easily reconfigurable reconstruction filters. Further, embodiments provide substantial power consumption, area, and cost savings compared to conventional solutions. For example, embodiments use all-passive filtering and substantially reduce active elements compared to conventional solutions. As a result, significant reductions in required area, noise, and power consumption can be achieved. In addition, embodiments perform filtering solely in the current domain, thereby eliminating the non-linear voltage-to-current conversion used in conventional circuits and enabling highly linear filtering. Furthermore, embodiments are highly programmable and easily reconfigurable without the use of tunable capacitors. As such, embodiments are very suitable solutions for multi-band multi-mode wireless transmitters.

Further embodiments, features, and advantages of the present invention, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will be described with reference to the accompanying drawings. Generally, the drawing in which an element first appears is typically indicated by the leftmost digit(s) in the corresponding reference number.

DETAILED DESCRIPTION OF EMBODIMENTS

Figure 1:
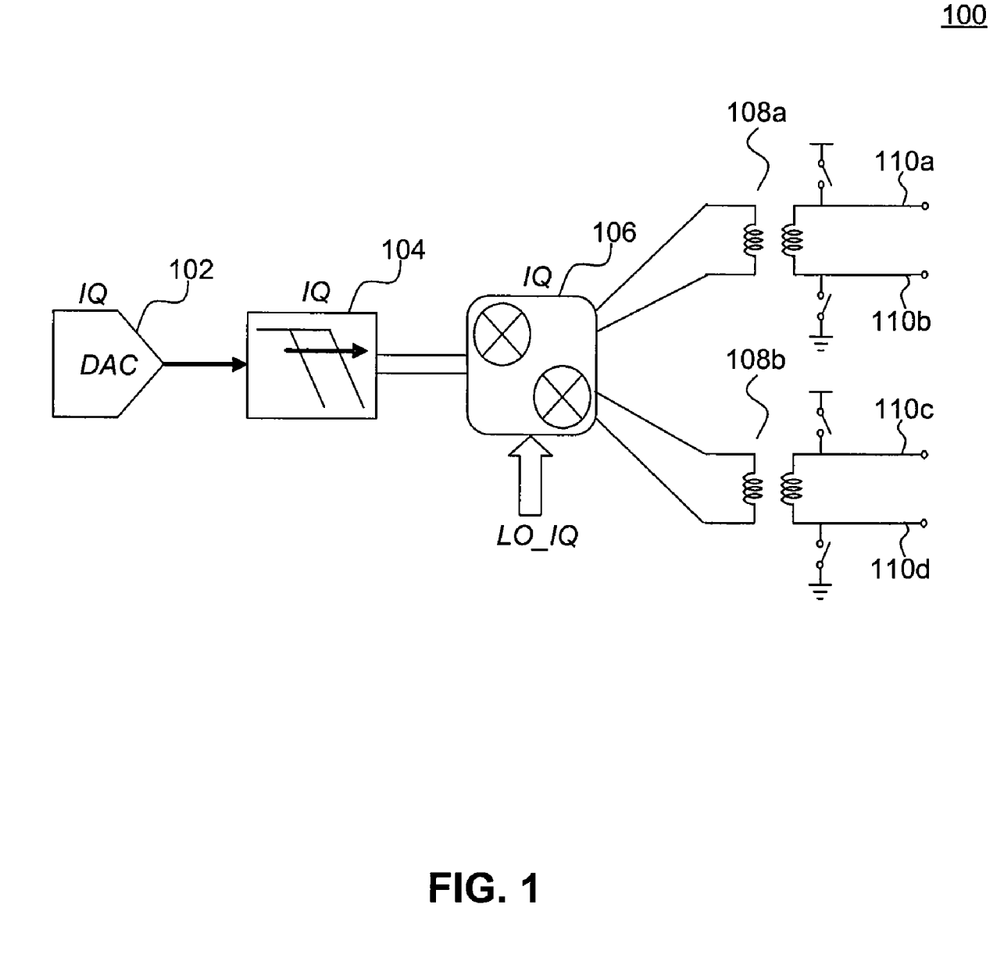
FIG. 1 illustrates an example wireless transmitter chain.

FIG. 1 illustrates an example wireless transmitter chain 100. Example transmitter chain 100 may be used in a multi-band multi-mode transmitter. As shown in FIG. 1, example transmitter chain 100 includes a digital-to-analog converter (DAC) 102, a reconstruction filter 104, an IQ mixer 106, and a plurality of transmit paths 110a-d.

DAC 102 receives a digital information signal from a baseband processor or a digital module of the transmitter. DAC 102 may be, for example, a 10-bit DAC. DAC 102 converts the received digital information signal from digital to analog. However, because of quantization noise inside DAC 102, the output of DAC 102 often includes, in addition to a desired baseband information component, undesired images of the baseband information component. The undesired images are typically located at multiples of the sampling frequency of DAC 102. Accordingly, a reconstruction filter, such as reconstruction filter 104, is generally used at the output of DAC 102 in order to generate an image-free baseband information signal.

The baseband output signal of reconstruction filter 104 is input into an IQ mixer 106. IQ mixer 106 up-converts the baseband signal to radio frequency (RF). Then, depending on the communication application being used by the transmitter (i.e., frequency band and transmission mode combination), the output of mixer 106 is coupled, via transformers 108a and 108b, to one of the plurality of transmit paths 110. For example, transmitter chain 100 includes four transmit paths 110a-d, with transmit paths 110a-b configured for high-band applications and transmit paths 110c-d configured for low-band applications. Further, within high-band transmit paths 110a-b (low-band transmit paths 110c-d), transmit path 110a (110c) may be configured for WCDMA signal transmission and transmit path 110b (110d) may be configured for EDGE/GSM signal transmission. Generally, transmit paths 110a-d each includes a power amplifier (PA) for amplifying and transmitting the RF signal.

Figure 2:
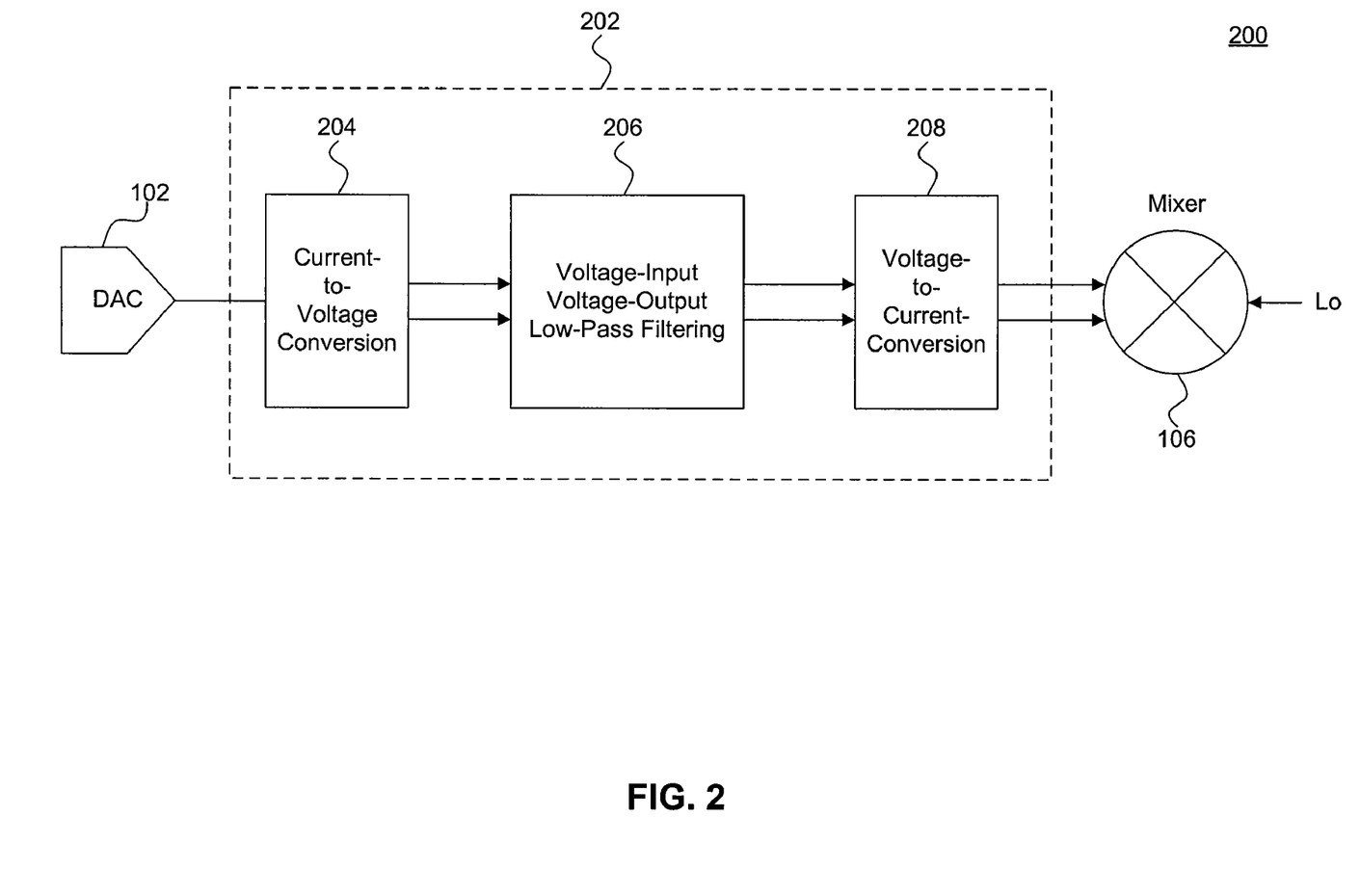
FIG. 2 illustrates a conventional wireless transmitter chain.

FIG. 2 illustrates a conventional wireless transmitter chain 200. In particular, FIG. 2 illustrates conventional reconstruction filtering solutions used in wireless transmitter chains. As shown in FIG. 2, transmitter chain 200 includes a DAC 102, a conventional reconstruction filter 202, and a mixer 106.

Reconstruction filter 202 sits at the output of DAC 102 in order to remove undesired images from the DAC 102 output. Conceptually, as shown in FIG. 2, reconstruction filter 202 includes a current-to-voltage conversion stage 204, a voltage-input voltage-output low pass filtering stage 206, and a voltage-to-current conversion stage 208. In practice, this is because DAC 102 initially generates a current output (generally, DAC 102 includes a plurality of current cells), conventional reconstruction filtering is performed in the voltage domain, and mixer 106 requires a current input.

Generally, stage 204 includes a trans-impedance circuit that converts a current output signal of DAC 102 to a voltage signal. Stage 206 includes a low-pass filter that filters the voltage output signal of stage 204 and generates a filtered voltage output signal. Stage 208 includes a voltage-to-current converter that converts the voltage output of stage 206 to a current signal.

One major drawback of reconstruction filter 202 relates to the inherent non-linearity of voltage-to-current conversion stage 208. To reduce the non-linear effects of stage 208, conventional solutions generally include a feedback mechanism implemented using one or more operational amplifiers. In addition, to support complex waveforms such as WCDMA, for example, the filtering stage 206 of reconstruction filter 202 needs to enable at least $3^{rd}$ order filtering. In conventional solutions, this is also implemented using at least three additional operational amplifiers. As a result, four or more operational amplifiers are typically used in conventional reconstruction filters, which results in not only high noise but also very large power consumption and area.

Furthermore, to enable multi-mode transmission (e.g., WCDMA, GSM, EDGE, etc.) by the transmitter, the reconstruction filter needs to be highly programmable. For example, for EDGE applications, the required filter bandwidth is only about 100 KHz. For WCDMA applications, on the other hand, the required bandwidth is approximately 2 MHz (20 times the EDGE required bandwidth). Conventional solutions suffer to meet such high programmability requirement primarily because of the large input capacitance of mixer 106, which acts as a loading capacitance for the reconstruction filter. In general, conventional solutions tend to use tunable capacitors, which are both large and expensive, in order to absorb the loading caused by the input capacitance of the mixer.

The above discussed drawbacks of conventional reconstruction filtering call for improved reconstruction filtering solutions. In particular, there is a need for reconstruction filters with small area, low power consumption, and low cost. In addition, reconstruction filters that are highly linear and configurable to support multi-band multi-mode transmitters are needed.

Embodiments of the present invention, as will be further described below, satisfy the above desired properties of reconstruction filters. For example, embodiments use all-passive filtering. As a result, active elements, such as operational amplifiers, which introduce high noise and power consumption are eliminated. In addition, embodiments perform filtering solely in the current domain, thereby eliminating the non-linear voltage-to-current conversion used in conventional solutions and enabling highly linear filtering. Furthermore, embodiments are highly programmable and easily reconfigurable without the use of tunable capacitors. As such, embodiments are highly suitable solutions for multi-band multi-mode wireless transmitters.

Figure 3:
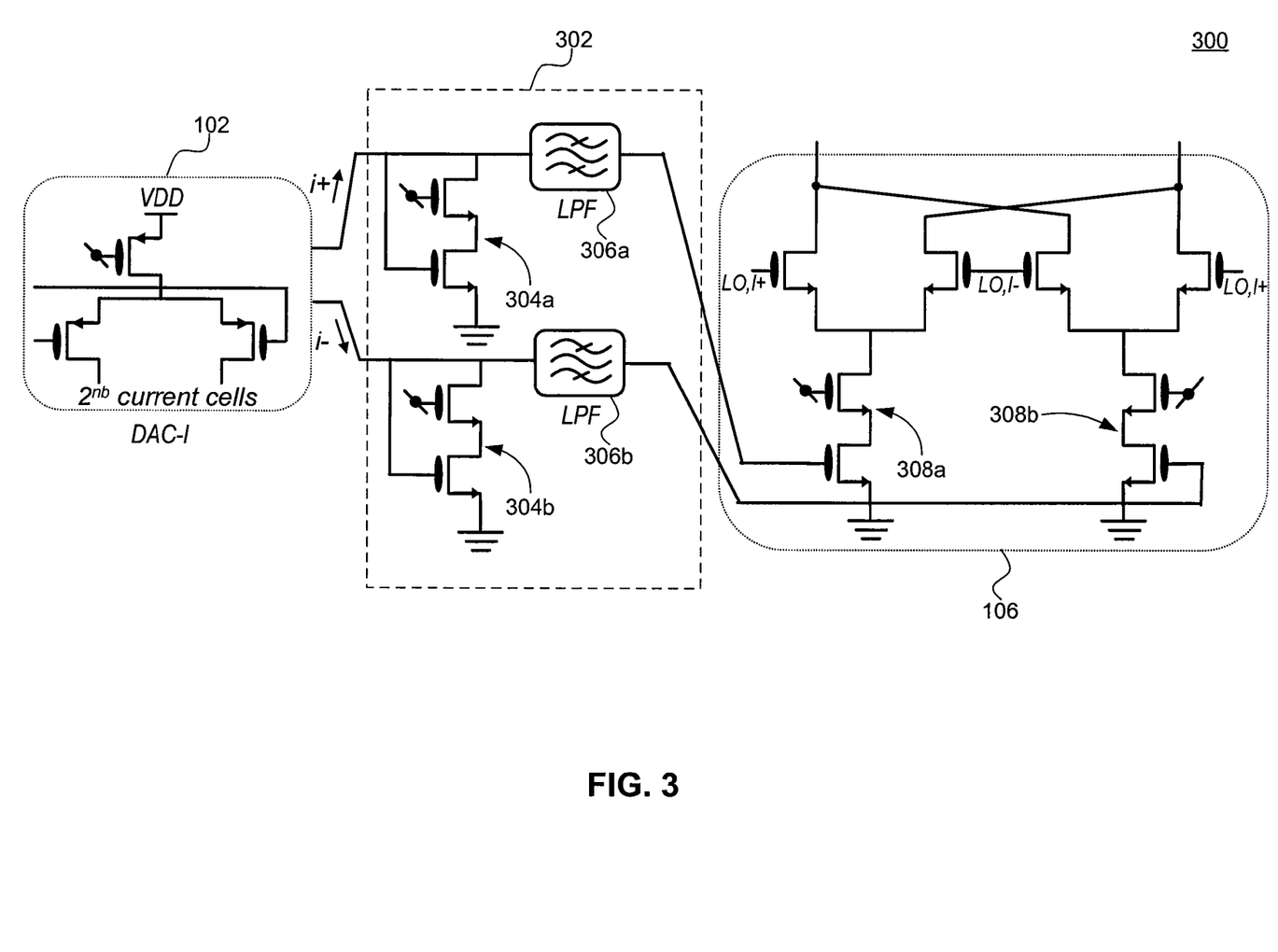
FIG. 3 illustrates an example wireless transmitter chain according to an embodiment of the present invention.

FIG. 3 illustrates an example wireless transmitter chain 300 according to an embodiment of the present invention. For ease of description, only the in-phase (I) branch of transmitter chain 300 is shown in FIG. 3 and described herein, with the quadrature-phase (Q) branch being identical to the I branch.

Example wireless transmitter chain 300 uses a reconstruction filter 302 according to an embodiment of the present invention. It is noted that reconstruction filter 302 represents a conceptual illustration of reconstruction filters according to embodiments of the present invention.

As shown in FIG. 3, reconstruction filter 302 couples DAC 102 to mixer 106. In particular, reconstruction filter 302 receives one or more current signals from DAC 102, and low-pass filters the one or more currents to generate one or more filtered current signals in mixer 106. In an embodiment, the one or more currents from DAC 102 include a desired information component and undesired image components located at multiples of a sampling frequency of DAC 102. The one or more filtered current signals contain only the desired information component, and also represent a filtered baseband information signal. It is noted that reconstruction filter 302 filters the DAC currents solely in the current domain to generate the one or more filtered current signals. As such, reconstruction filter 302 represents a current-input current-output filter. Further, reconstruction filter 302 uses no current-to-voltage conversion, voltage-to-voltage filtering, or voltage-to-current conversion as in conventional solutions. As a result, reconstruction filter 302 exhibits very high linearity.

In a differential implementation, as shown in FIG. 3, reconstruction filter 302 receives a differential current output signal, including currents i+ and i−, from DAC 102. Accordingly, reconstruction filter 302 includes first and second filtering branches, configured to filter respectively the i+ and i− currents of DAC 102. In a single-ended implementation, reconstruction filter 302 includes a single filtering branch and receives a single current output signal from DAC 102.

In an embodiment, the first and second filtering branches of reconstruction filter 302 each includes an input stage 304 and a low-pass filter (LPF) stage 306. Input stages 304a-b include one or more input transistors and are used to receive current outputs of DAC 102. For example, in the embodiment of FIG. 3, currents i+ and i− generated by DAC 102 are mirrored respectively into input transistors 304a and 304b of the first and second filtering branches.

LPF stages 306a-b provide low-pass filtering of the received DAC currents. In an embodiment, each of LPF stages 306a-b includes an all-passive reconfigurable resistor-capacitor (RC) network. The filtered current signals produced by reconstruction filter 302 are generated directly in mixer 106. In an embodiment, the filtered current output signals of LPF stages 306a-b are generated respectively in transistors 308a-b of mixer 106. The filtered current output signals are then mixed with in-phase differential local oscillator (LO) signals, LO, I+ and LO, I−, to generate an up-converted RF signal.

According to embodiments of the present invention, the reconfigurable RC network of LPF stages 306a-b enables reconstruction filter 302 to have a highly programmable transfer function. For example, on one hand, for simple waveforms reconstruction filter 302 can be programmed to operate as a single order filter. On the other hand, for complex waveforms, such as WCDMA, for example, reconstruction filter 302 can be programmed to operate as a third-order filter (e.g., third-order Butterworth).

In addition, the RC network of LPF stages 306a-b enables reconstruction filter 302 to be easily reconfigurable. In an embodiment, the transfer function of reconstruction filter 302 can be reconfigured by varying a time constant of the RC network. In another embodiment, the transfer function of reconstruction filter 302 can be reconfigured by simply varying one or more resistors in the RC network.

Because LPF stages 306a-b use an all passive RC network, reconstruction filter 302 has a minimum of active elements (e.g., operational amplifiers), which significantly reduces power consumption, area, and cost requirements of embodiments of the present invention compared to conventional solutions. In addition, in embodiments, only device capacitors (e.g., MOS capacitors) are used in the RC network. As such, the loading caused by the large input capacitance of mixer 106 can be absorbed, without affecting the programmability of reconstruction filter 102. This is in addition to requiring less area by using device capacitors.

Example implementations of reconstruction filter 302 according to embodiments of the present invention are described below with reference to FIGS. 4-7. As would be understood by a person skilled in the art based on the teachings herein, embodiments of the present invention are not limited to the example implementations provided herein, but extend to any variations and or improvements which would be apparent to a person skilled in the art.

Figure 4:
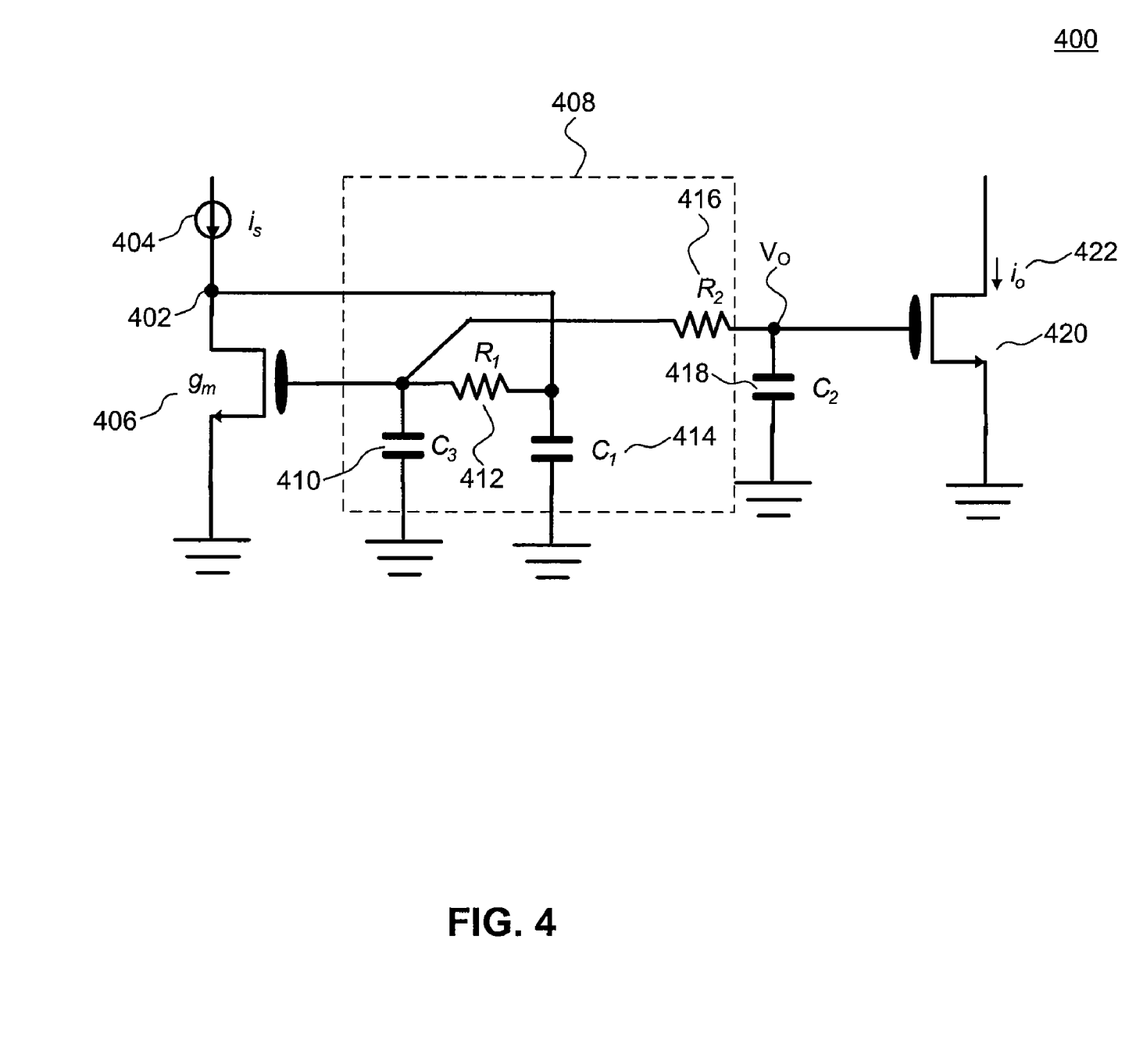
FIG. 4 illustrates an example implementation of a reconstruction filter according to an embodiment of the present invention.

FIG. 4 illustrates an example implementation 400 of a reconstruction filter according to an embodiment of the present invention. In particular, FIG. 4 shows a reconstruction filter according to an embodiment of the present invention coupled to the input stage of a subsequent circuit. In an embodiment, the subsequent circuit includes a mixer, as shown above in FIG. 3.

According to example implementation 400, the reconstruction filter includes an input node 402, an input transistor 406, and an all-passive resistor-capacitor (RC) network 408. The reconstruction filter is coupled to an input stage of a mixer, which includes an input capacitor $C_2$ 418 and an input transistor 420. Generally, input capacitor $C_2$ 418 has a very large capacitance.

Input node 402 receives an input current signal $i_S$ 404. In an embodiment, input current signal $i_S$ 404 is received from a digital-to-analog converter (DAC) and contains a desired information component and undesired image components located at multiples of a sampling frequency of the DAC.

Input transistor 406 has a first terminal coupled to input node 402 and a second terminal coupled to ground. A third terminal of input transistor 406 is coupled to RC network 408, which is also coupled to the input stage of the mixer. In an embodiment, input transistor 406 forms a current mirror circuit with input transistor 420 of the mixer coupled to the reconstruction filter.

In an embodiment, RC network 408 includes a first capacitor $C_3$ 410 having a first end coupled to the third terminal of the input transistor 406 and a second end coupled to ground; a first resistor $R_1$ 412 having a first end coupled to the first end of first capacitor $C_3$ 410 and a second end coupled to input node 402; a second capacitor $C_1$ 414 having a first end coupled to input node 402 and a second end coupled to ground; and a second resistor $R_2$ 416 having a first end coupled to the first end of first resistor $R_1$ 412 and a second end coupled to the subsequent circuit coupled to the reconstruction filter circuit. In an embodiment, the second end of $R_2$ 416 is coupled to a gate terminal of input transistor 420 of the mixer.

In an embodiment, first capacitor $C_3$ 410 and second capacitor $C_1$ 414 are matched to input capacitor $C_2$ 418 of the mixer. This reduces variations in output current signal $i_O$ 422 that are due to temperature/process variations in the first and second capacitors and the input capacitor of the mixer. In another embodiment, first capacitor $C_3$ 410 and second capacitor $C_1$ 414 have substantially equal DC bias as input capacitor $C_2$ 418 of the mixer. In addition, in embodiments, only device capacitors (e.g., MOS capacitors) are used in RC network 408. As such, the loading caused by the large capacitance of input capacitor $C_2$ 418 can be absorbed, without affecting the programmability of reconstruction filter 102. This is in addition to requiring less area by using device capacitors.

In an embodiment, the reconstruction filter filters input current signal $i_S$ 404 to generate an output current signal $i_O$ 422 in input transistor 420 of the mixer. Output current signal $i_O$ 422 contains only the desired information component of input current signal $i_S$ 404. In an embodiment, output current signal $i_O$ 422 represents a filtered baseband information signal, which is subsequently upconverted by the mixer to RF.

Note that according to example implementation 400, the reconstruction filter includes a feedback loop, formed by the coupling of the second end of first resistor $R_1$ 412 to input node 402. As such, the reconstruction filter can have complex poles and may thus be configured as a Butterworth filter, for example. In an embodiment, the reconstruction filter is programmable to operate as a third-order Butterworth filter.

In an embodiment, a transfer function of the reconstruction filter of FIG. 4 can be written as:

$$H(s) = \frac{V_O}{i_s} = \frac{1}{R_1 R_2 C_1 C_2 C_3 s^3 + (R_2 C_2 C_3 + R_1 C_1 C_2 + R_1 C_1 C_3 + R_2 C_1 C_2)s^2 + (C_1 + C_2 + C_3 + g_m R_2 C_2)s + g_m}$$

where $V_O$ represents the voltage at the input of the mixer, as shown in FIG. 4.

According to embodiments, the transfer function of the reconstruction filter is programmable by varying a time constant of RC network 408. In an embodiment, the transfer function of the reconstruction filter is programmable solely by varying one or more of first resistor $R_1$ 412 and second resistor $R_2$ 416. In an embodiment, first resistor $R_1$ 412 and second resistor $R_2$ 416 are implemented as switch-programmable resistors, which enables the reconstruction filter to be easily reconfigurable. On the other hand, first capacitor $C_3$ 410 and second capacitor $C_1$ 414 are implemented as fixed value capacitors.

As described above, the reconstruction filter filters input current signal $i_S$ 404 solely in the current domain to generate output current signal $i_O$ 422. As such, embodiments avoid current-to-voltage and voltage-to-current conversion used in conventional solutions, and enable highly linear filtering. In addition, it is noted that any noise caused by input transistor 406 is filtered in the same manner as input current signal $i_S$ 404. Accordingly, output current signal $i_O$ 422 exhibits very low noise levels.

Figure 5:
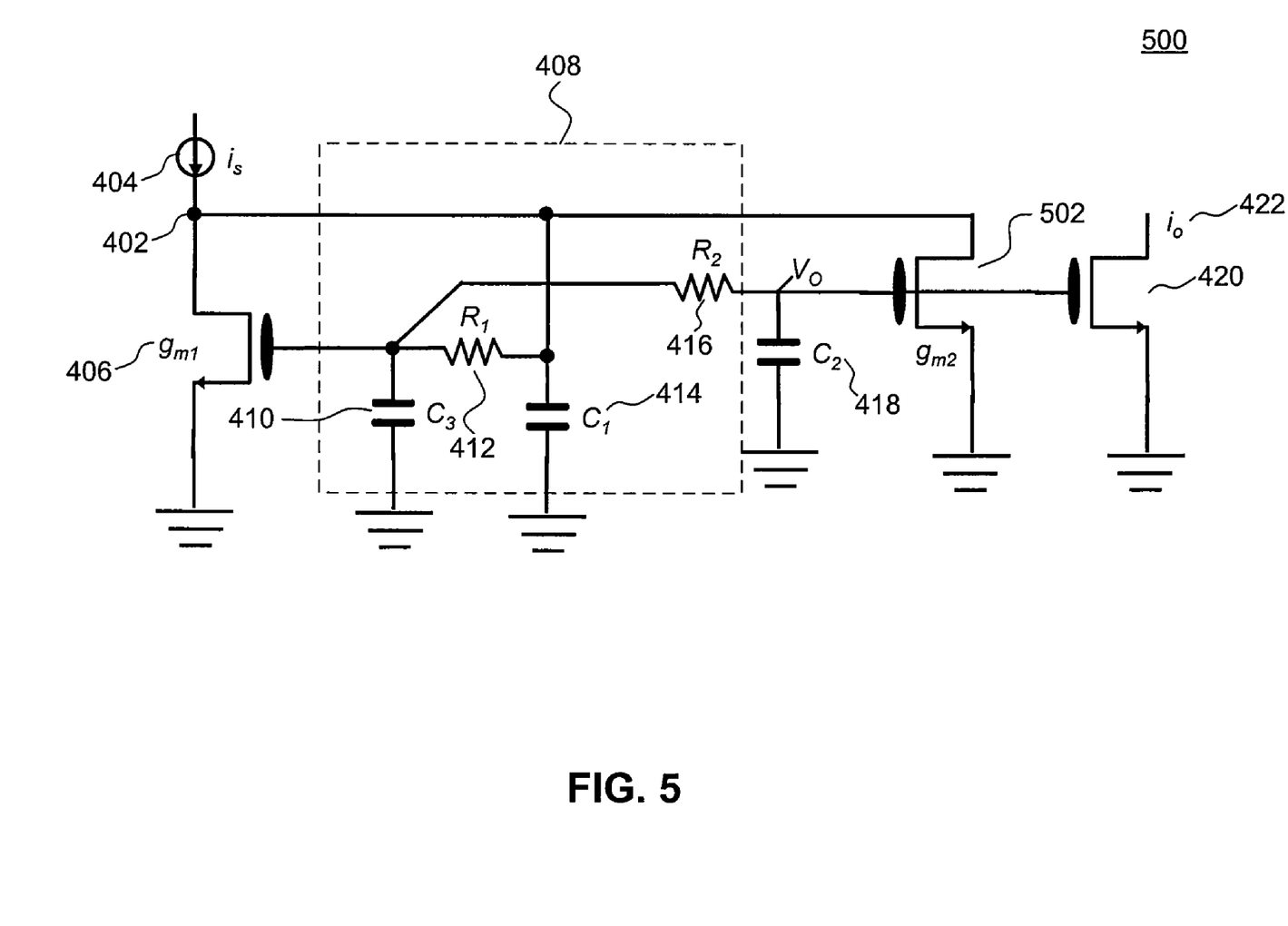
FIG. 5 illustrates an example implementation of a reconstruction filter according to an embodiment of the present invention.

FIG. 5 illustrates another example implementation 500 of a reconstruction filter according to an embodiment of the present invention. Similar to FIG. 4, FIG. 5 shows a reconstruction filter according to an embodiment of the present invention coupled to the input stage of a subsequent circuit. In an embodiment, the subsequent circuit includes a mixer, as shown above in FIG. 3.

Example implementation 500 is structurally similar to example implementation 400, but also includes an output transistor 502, as shown in FIG. 5. Output transistor 502 has a drain terminal coupled to input node 402, a source terminal coupled to ground, and a gate terminal coupled to the gate terminal of input transistor 420 of the mixer.

The transfer function of the reconstruction filter of FIG. 5 can be written as:

$$H(s) = \frac{V_O}{i_s} = \frac{1}{R_1 R_2 C_1 C_2 C_3 s^3 + (R_2 C_2 C_3 + R_1 C_1 C_2 + R_1 C_1 C_3 + R_2 C_1 C_2)s^2 + (C_1 + C_2 + C_3 + g_{m1} R_2 C_2)s + g_{m1} + g_{m2}}$$

where $V_O$ represents the voltage at the input of the mixer, as shown in FIG. 5.

In an embodiment, input transistor 406 and output transistor 502 are matched according to a transconductance ratio, which allows example implementation 500 to have a smaller area compared to example implementation 400. Further, example implementation 500 may be suited for cases in which input current signal $i_S$ 404 has a small AC signal swing (e.g., less than 25%).

Figure 6:
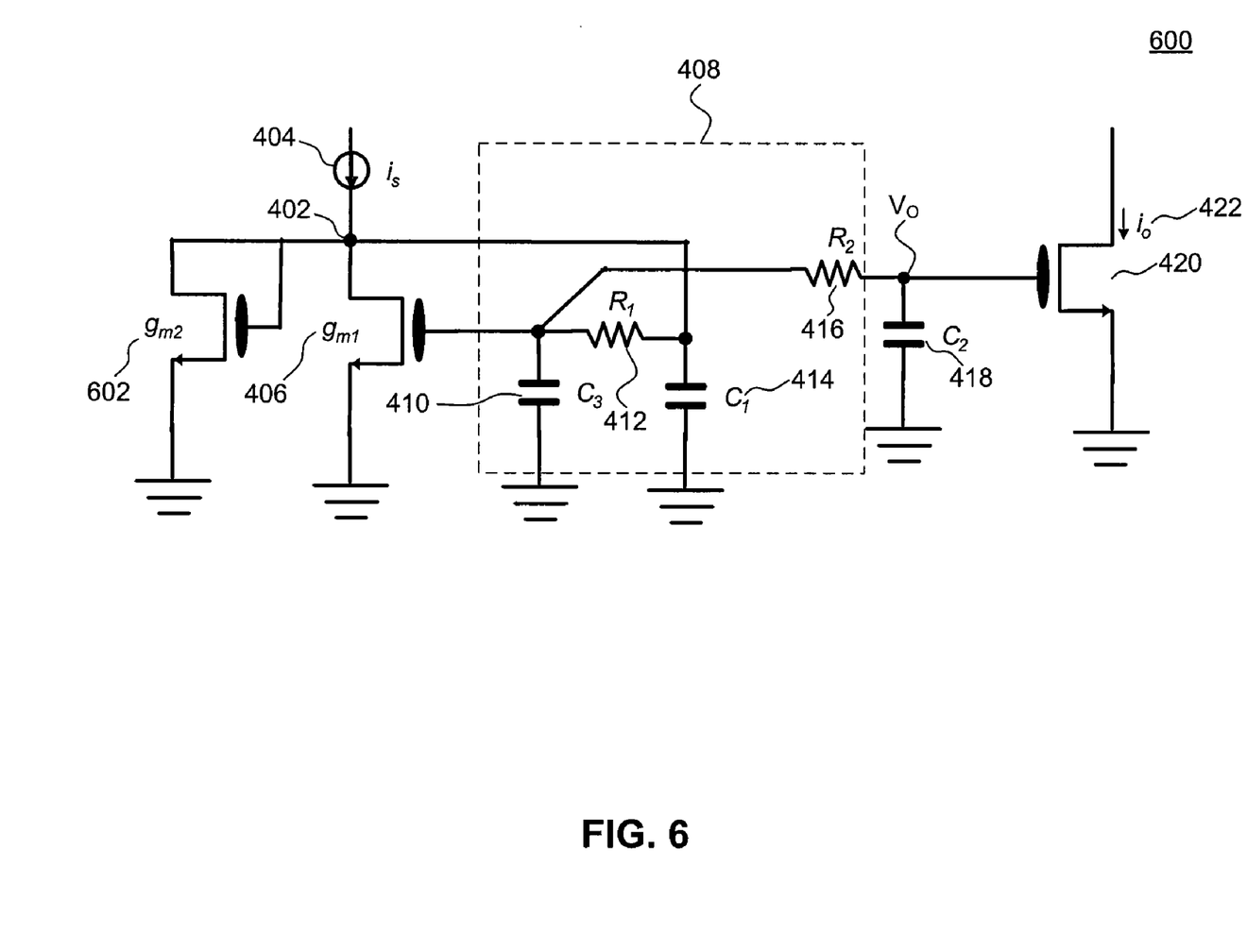
FIG. 6 illustrates an example implementation of a reconstruction filter according to an embodiment of the present invention.

FIG. 6 illustrates another example implementation 600 of a reconstruction filter according to an embodiment of the present invention. Similar to FIG. 4, FIG. 6 shows a reconstruction filter according to an embodiment of the present invention coupled to the input stage of a subsequent circuit. In an embodiment, the subsequent circuit includes a mixer, as shown above in FIG. 3.

Example implementation 600 is structurally similar to example implementation 400, but also includes a diode-connected transistor 602 having a first terminal and a second terminal coupled to input node 402 and a third terminal coupled to ground. The transfer function of the reconstruction filter of FIG. 6 can be written as:

$$H(s) = \frac{V_O}{i_S} = $$

$$\frac{1}{R_1 R_2 C_1 C_2 C_3 s^3 + (R_2 C_2 C_3 + R_1 C_1 C_2 + R_1 C_1 C_3 + R_2 C_1 C_2 + g_{m2} R_1 R_2 C_2 C_3)s^2 + (C_1 + C_2 + C_3 + g_{m1} R_2 C_2 + g_{m2}(R_1 C_3 + R_2 C_2 + R_1 C_2))s + g_{m1} + g_{m2}}$$

where $V_O$ represents the voltage at the input of the mixer, as shown in FIG. 6.

Figure 7:
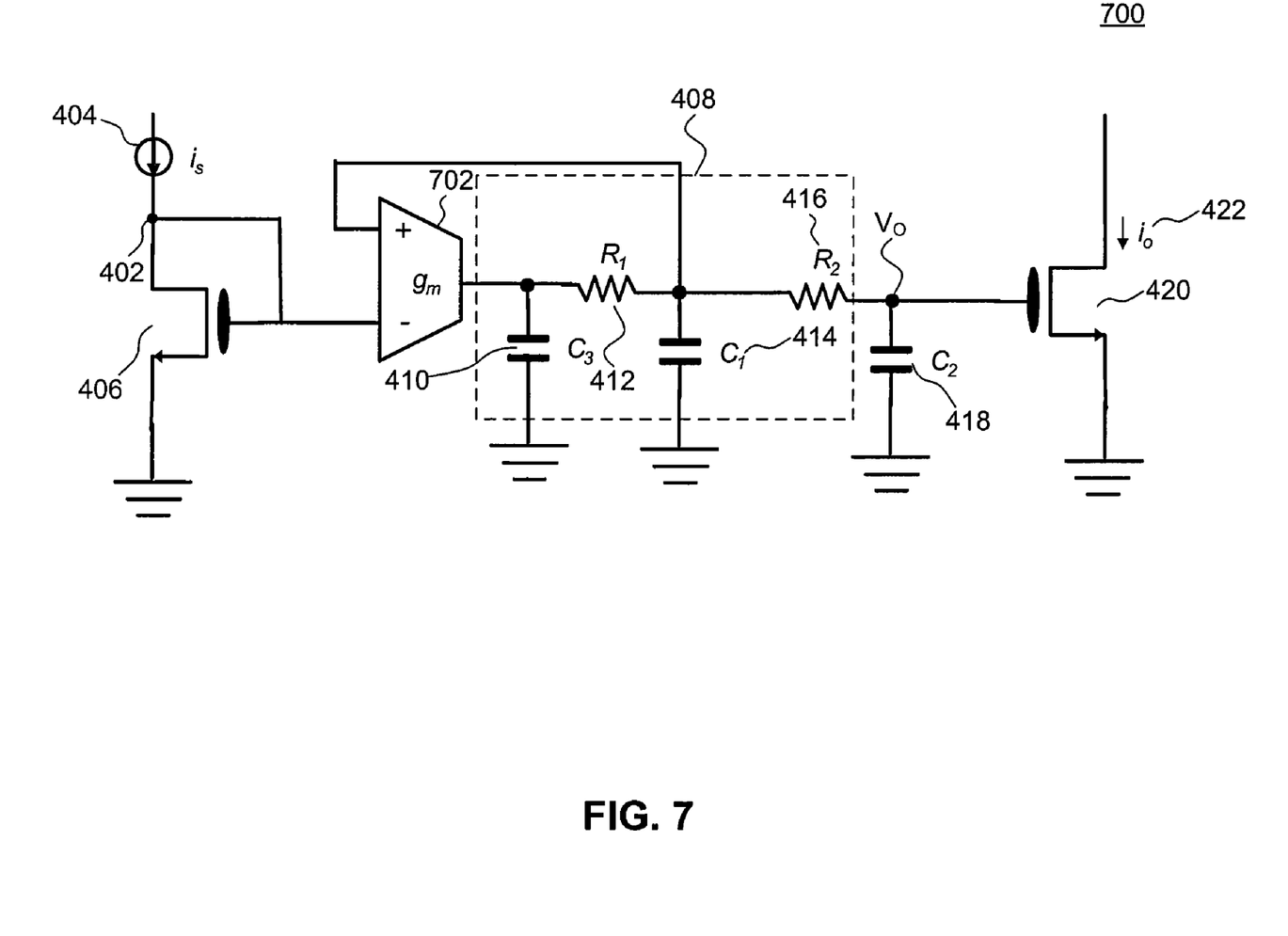
FIG. 7 illustrates an example implementation of a reconstruction filter according to an embodiment of the present invention.

FIG. 7 illustrates another example implementation 700 of a reconstruction filter according to an embodiment of the present invention. Similar to FIG. 4, FIG. 7 shows a reconstruction filter according to an embodiment of the present invention coupled to the input stage of a subsequent circuit. In an embodiment, the subsequent circuit includes a mixer, as shown above in FIG. 3.

Example implementation 700 is structurally similar to example implementation 400, but also includes an operational amplifier 702 coupled between input transistor 406 and RC network 408. As such, the first and third terminals of input transistor 406 are coupled to one another and also to the inverting input of operational amplifier 702. The non-inverting input of operation amplifier 702 is coupled to the second end of first resistor $R_1$ 412, forming a feedback loop in the reconstruction filter. The output terminal of operational amplifier 702 is coupled to the first end of first resistor $R_1$ 412.

The transfer function of the reconstruction filter of FIG. 7 can be written as:

$$H(s) = \frac{i_O}{i_S} = $$

$$\frac{g_m}{R_1 R_2 C_1 C_2 C_3 s^3 + (R_2 C_2 C_3 + R_1 C_3 C_2 + R_1 C_1 C_3 + R_2 C_1 C_2)s^2 + (C_1 + C_2 + C_3 + g_{m1} R_2 C_2)s + g_m}.$$

As would be understood by a person skilled in the art based on the teachings herein, example implementations 500, 600, and 700 have similar functionality, operation, and performance as described above with respect to example implementation 400. In addition, similar implementations as described above with respect to example implementation 400 can be applied in example implementations 500, 600, and 700.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

Embodiments of the present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of embodiments of the present invention should not be limited by any of the above-described exemplary embodiments, but should be defined only in accordance with the following claims and their equivalents.

What is claimed is:

1. A reconstruction filter circuit, comprising:
    an input node that receives an input current signal;
    an input transistor having a first terminal coupled to the input node and a second terminal coupled to ground; and
    an passive resistor-capacitor (RC) network, coupled between a third terminal of the input transistor and a subsequent circuit coupled to the reconstruction filter circuit;
    wherein the reconstruction filter circuit filters the input current signal to generate an output current signal in the subsequent circuit, and wherein the RC network includes a feedback loop that couples a node of the RC network to the input node, thereby causing the reconstruction filter circuit to have one or more complex poles.

2. The reconstruction filter circuit of claim 1, wherein the input current signal is received from a digital-to-analog converter (DAC), the input current signal containing a desired information component and undesired image components located at multiples of a sampling frequency of the DAC.

3. The reconstruction filter circuit of claim 2, wherein the output current signal contains only the desired information component of the input current signal.

4. The reconstruction filter circuit of claim 1, wherein the subsequent circuit coupled to the reconstruction filter circuit includes a mixer, and wherein the output current signal represents a filtered baseband information signal to be up-converted by the mixer.

5. The reconstruction filter circuit of claim 1, wherein the reconstruction filter circuit filters the input current signal solely in the current domain to generate the output current signal.

6. The reconstruction filter circuit of claim 1, wherein a transfer function of the reconstruction filter circuit is programmable by varying a time constant of the RC network.

7. The reconstruction filter circuit of claim 1, wherein a transfer function of the reconstruction filter circuit is programmable solely by varying one or more resistors of the RC network.

8. The reconstruction filter circuit of claim 1, wherein capacitors of the RC network have fixed values.

9. The reconstruction filter circuit of claim 1, wherein capacitors of the RC network are device capacitors.

10. The reconstruction filter circuit of the claim 1, wherein capacitors of the RC network are MOS capacitors.

11. The reconstruction filter circuit of claim 1, wherein resistors of the RC network are switch-programmable resistors.

12. The reconstruction filter circuit of claim 1, wherein the reconstruction filter circuit is programmable to operate as a third-order Butterworth filter.

13. The reconstruction filter circuit of claim 1, wherein the RC network comprises:
a first capacitor having a first end coupled to the third terminal of the input transistor and a second end coupled to ground;
a first resistor having a first end coupled to the first end of the first capacitor and a second end coupled to the input node;
a second capacitor having a first end coupled to the input node and a second end coupled to ground; and
a second resistor having a first end coupled to the first end of the first resistor and a second end coupled to the subsequent circuit coupled to the reconstruction filter circuit.

14. The reconstruction filter circuit of claim 1, wherein the input transistor forms a current mirror circuit with an input transistor of the subsequent circuit coupled to the reconstruction filter circuit.

15. A reconstruction filter circuit, comprising:
an input node that receives an input current signal;
an input transistor having a first terminal coupled to the input node and a second terminal coupled to ground;
a first capacitor having a first end coupled to a third terminal of the input transistor and a second end coupled to ground;
a first resistor having a first end coupled to the first end of the first capacitor and a second end coupled to the input node;
a second capacitor having a first end coupled to the input node and a second end coupled to ground; and
a second resistor having a first end coupled to the first end of the first resistor and a second end coupled to an input terminal of a subsequent circuit coupled to the reconstruction filter circuit,
wherein coupling the second end of the first resistor to the input node forms a feedback loop within the reconstruction filter, thereby causing the reconstruction filter circuit to have one or more complex poles.

16. The reconstruction filter circuit of claim 15, wherein the input terminal of the subsequent circuit coupled to the reconstruction filter circuit is a gate terminal of a MOS transistor, and wherein the input node is further coupled to a drain terminal of the MOS transistor.

17. The reconstruction filter circuit of claim 15, further comprising:
a diode-connected transistor having a first terminal and a second terminal coupled to the input node and a third terminal coupled to ground.

18. The reconstruction filter circuit of claim 15, wherein the first terminal and the third terminal of the input transistor are coupled to each other, further comprising:
an operational amplifier having first and second input terminals and an output terminal, wherein the first input terminal is coupled to the input node, the second input terminal is coupled to the second end of the first resistor, and the output terminal is coupled to the first end of the first resistor.

19. The reconstruction filter circuit of claim 15, wherein the first and second capacitors have fixed values.

20. The reconstruction filter circuit of claim 15, wherein the first and second capacitors are device capacitors.

21. The reconstruction filter circuit of claim 15, wherein the first and second capacitors are MOS capacitors.

22. The reconstruction filter circuit of claim 15, wherein the first and second capacitors are matched to an input capacitor of the subsequent circuit, thereby reducing variations in the output current signal due to temperature/process variations in the first and second capacitors and the input capacitor of the subsequent circuit.

23. The reconstruction filter circuit of claim 22, wherein the first and second capacitors have substantially equal DC bias as the input capacitor of the subsequent circuit.

24. The reconstruction filter circuit of claim 15, wherein a transfer function of the reconstruction filter circuit is programmable by varying one or more of the first and second resistors.

25. The reconstruction filter circuit of claim 15, wherein the first and second resistors are switch-programmable resistors.

26. The reconstruction filter circuit of claim 15, wherein the reconstruction filter circuit is programmable to operate as a third-order Butterworth filter.

27. The reconstruction filter circuit of claim 15, wherein the reconstruction filter circuit filters the input current signal solely in the current domain to generate the output current signal.

* * * * *